(12) United States Patent
Svensson et al.

(10) Patent No.: US 11,733,187 B2
(45) Date of Patent: Aug. 22, 2023

(54) VERIFICATION PLATES WITH AUTOMATED EVALUATION OF MELT PERFORMANCE

(71) Applicant: Arcam AB, Mölnlycke (SE)

(72) Inventors: David Svensson, Mölndal (SE); Phillip Simon Mahoney, Mölndal (SE)

(73) Assignee: Arcam AB, Mölnlycke (SE)

( * ) Notice: Subject to any disclaimer, the term of this patent is extended or adjusted under 35 U.S.C. 154(b) by 358 days.

(21) Appl. No.: 17/175,115

(22) Filed: Feb. 12, 2021

(65) Prior Publication Data

US 2022/0260509 A1    Aug. 18, 2022

(51) Int. Cl.
*G01N 23/225* (2018.01)
*H01J 37/305* (2006.01)
(Continued)

(52) U.S. Cl.
CPC ......... *G01N 23/2252* (2013.01); *B22F 10/28* (2021.01); *B22F 10/31* (2021.01); *B22F 10/36* (2021.01); *B22F 10/85* (2021.01); *B22F 12/90* (2021.01); *B23K 15/002* (2013.01); *B23K 15/0013* (2013.01); *B23K 15/0086* (2013.01); *B33Y 10/00* (2014.12); *B33Y 30/00* (2014.12); *B33Y 50/02* (2014.12); *H01J 37/244* (2013.01);
(Continued)

(58) Field of Classification Search
CPC .......... B22F 10/28; B22F 10/31; B22F 10/36; B22F 10/85; B22F 12/90; B23K 15/0013; B23K 15/002; B23K 15/0086; B33Y 10/00; B33Y 30/00; B33Y 50/02; G01N 23/2252; G01N 2223/079; G01N 2223/303; G01N 2223/507; H01J 37/244; H01J 37/305; H01J 2237/2445; H01J 2237/2448; H01J 2237/304; H01J 2237/30433; H01J 2237/3128
See application file for complete search history.

(56) References Cited

U.S. PATENT DOCUMENTS 6,483,596 B1   11/2002   Philippi et al.
7,158,241 B2    1/2007   Slesinski et al.
(Continued)

FOREIGN PATENT DOCUMENTS

EP      3789140 A1  *  3/2021  .............. B22F 10/28
WO      03004212 A1     1/2003
WO    2012041346 A1     4/2012

*Primary Examiner* — Mark R Gaworecki
(74) *Attorney, Agent, or Firm* — Dinsmore & Shohl LLP

(57) ABSTRACT

An electron beam additive manufacturing system includes an electron beam source, an x-ray detection sensor configured to generate a waveform corresponding to an amount of x-rays detected by the x-ray detection sensor, and an electronic control unit comprising a processor and a non-transitory computer-readable memory, the electronic control unit communicatively coupled to the electron beam source and the x-ray detection sensor. The electronic control unit is configured to cause the electron beam source to emit an electron beam such that the electron beam impinges a verification plate, receive the waveform generated by the x-ray detection sensor in response to the x-ray detection sensor capturing x-rays emitted from the impingement of the electron beam with the verification plate, and determine a melt performance of a surface material of the verification plate based on the waveform.

20 Claims, 7 Drawing Sheets

(51) Int. Cl.
*H01J 37/244* (2006.01)
*B22F 10/28* (2021.01)
*B22F 12/90* (2021.01)
*B22F 10/36* (2021.01)
*B22F 10/85* (2021.01)
*B22F 10/31* (2021.01)
*B33Y 30/00* (2015.01)
*B33Y 50/02* (2015.01)
*B33Y 10/00* (2015.01)
*B23K 15/00* (2006.01)
*G01N 23/2252* (2018.01)

(52) U.S. Cl.
CPC ...... *H01J 37/305* (2013.01); *G01N 2223/079* (2013.01); *G01N 2223/303* (2013.01); *G01N 2223/507* (2013.01); *H01J 2237/2448* (2013.01); *H01J 2237/30433* (2013.01); *H01J 2237/3128* (2013.01)

(56) References Cited

U.S. PATENT DOCUMENTS

| | | |
|---|---|---|
| 8,598,523 B2 | 12/2013 | Stecker et al. |
| 9,801,760 B2 | 10/2017 | Goos et al. |
| 10,049,852 B2 | 8/2018 | Mullen et al. |
| 10,388,486 B2 | 8/2019 | Mullen et al. |
| 2005/0205778 A1 | 9/2005 | Kitai et al. |
| 2018/0178449 A1 | 6/2018 | Cheverton et al. |
| 2019/0134747 A1 | 5/2019 | Herzog et al. |
| 2021/0122120 A1* | 4/2021 | Raghavan ............... B22F 12/33 |

* cited by examiner

VERIFICATION PLATES WITH AUTOMATED EVALUATION OF MELT PERFORMANCE

TECHNICAL FIELD

The present specification generally relates to systems and methods for automatically evaluating melt performance in an additive manufacturing system and, more specifically, to automatic calibration, verification, and process development techniques for an electron beam additive manufacturing (EBM) device.

BACKGROUND

Additive manufacturing is a manufacturing process of forming a three-dimensional component from a computer model by systematically adding material to a build platform and selectively joining, curing, and/or solidifying the added material with a power source or application of a secondary material typically in a layer-by-layer build process. There are many additive manufacturing processes. Some common processes are referred to as 3-D printing where molten or uncured material is deposited in a computer-generated pattern to form a 3-D component. Other processes include depositing layer upon layer of material on a build platform and selectively focusing a power source on portions of each layer to join, cure, and/or solidify portions of the material thereby forming a 3-D component.

Regardless of the mechanism that is implemented to form the 3-D part, material-dispensing mechanisms, power sources, and the like need to be calibrated and verified. Currently, calibration methods implement third party systems to measure beam properties. Furthermore, systems and methods of determining melt performance of an additive manufacturing system typically require processing multiple layers of powder, which slows development times and can use many kilograms of powder in the process.

Accordingly, a need exists for an automated calibration, verification, and process development system for additive manufacturing devices such as EBM machines.

SUMMARY

In embodiments, an electron beam additive manufacturing system includes an electron beam source, an x-ray detection sensor configured to generate a waveform corresponding to an amount of x-rays detected by the x-ray detection sensor, and an electronic control unit comprising a processor and a non-transitory computer-readable memory, the electronic control unit communicatively coupled to the electron beam source and the x-ray detection sensor. The electronic control unit is configured to cause the electron beam source to emit an electron beam such that the electron beam impinges a verification plate, receive the waveform generated by the x-ray detection sensor in response to the x-ray detection sensor capturing x-rays emitted from the impingement of the electron beam with the verification plate, and determine a melt performance of a surface material of the verification plate based on the waveform.

In embodiments, a method of determining melt performance of a material impinged by an electron beam in an additive manufacturing system includes causing, with an electronic control unit, an electron beam source to emit an electron beam such that the electron beam impinges a verification plate, receiving, with the electronic control unit, a waveform generated by an x-ray detection sensor in response to the x-ray detection sensor capturing x-rays emitted from the impingement of the electron beam with the verification plate, and determining a melt performance of a surface material of the verification plate based on the waveform.

In embodiments, a method of verifying an electron beam configuration of an additive manufacturing system includes causing an electron beam source to emit an electron beam such that the electron beam impinges a verification plate, wherein the electron beam is configured to impinge the verification plate with a predetermined size, a predetermined shape, moving across the verification plate at a predetermined velocity; receiving, with an electronic control unit, a waveform generated by an x-ray detection sensor in response to the x-ray detection sensor capturing x-rays emitted from the impingement of the electron beam with the verification plate, and determining a melt performance of a surface material of the verification plate based on the waveform, comparing the melt performance determined based on the waveform with an expected melt performance for the emitted electron beam and the verification plate, and adjusting at least one of the predetermined size, the predetermined shape, or predetermined velocity of the electron beam when the melt performance determined based on the waveform does not meet the expected melt performance with in an acceptable tolerance.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure relate to systems and methods for determining a melt performance of a verification plate impinged by an electron beam in an additive manufacturing system. The systems and methods described herein take advantage of the x-ray emission behavior of an electron beam to produce an x-ray signal that directly relates to the density of the exposed material. That is, when an electron beam impinges material such as a bimetallic plate x-rays are emitted. This means that once the surface material has been melted and the subsurface (e.g., tungsten) is exposed, a digital signal is generated by an x-ray detection sensor in response to the emitted x-rays which can then be related to beam behavior with respect to material melting. More specifically, the present disclosure uses the melting behavior of a bimetallic plate to measure the beam properties in an additive manufacturing (AM) system for calibration, verification and process development of AM materials.

Embodiments provided herein circumvent the need to measure the beam properties in an AM system by a third party measurement and instead utilize in-situ measuring and detection devices that directly correlate beam behavior based on how it melts a material during an AM process to the beam properties. Such embodiments provide a means for accurate pass/fail criteria for machines based on actual process related measurements. Moreover, embodiments described herein may improve the speed at which material development occurs while also saving hundreds or even thousands of kilograms of powder, the powder is replaced with a verification plate having at least two layers of metal.

Various embodiments for automatically measuring beam properties based on melt performance of a verification plate are described in further detail below with specific reference to the appended drawings.

Figure 1:
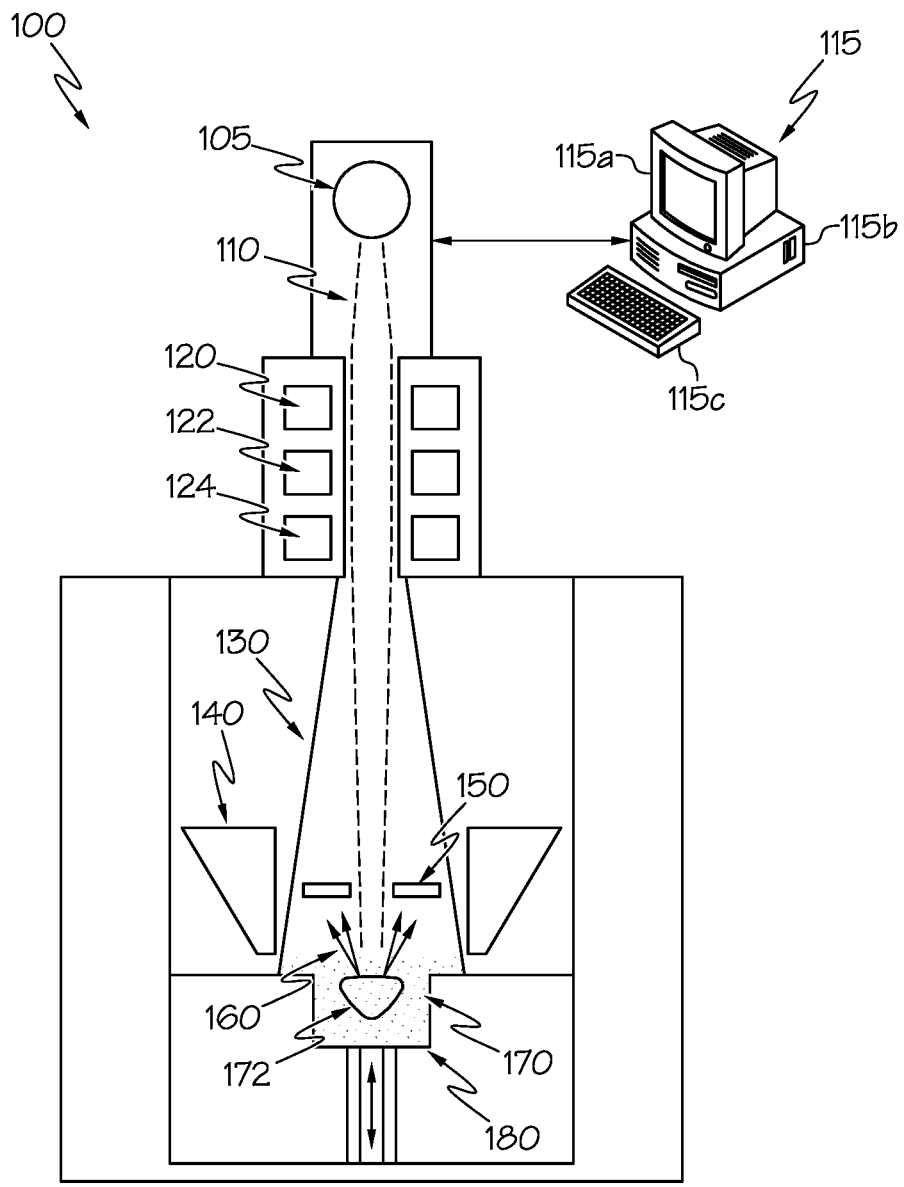
FIG. 1 schematically depicts an electron beam additive manufacturing system according to one or more embodiments shown and described herein.

Referring now to FIG. 1, FIG. 1 schematically depicts an electron beam additive manufacturing system 100. It should be understood that the illustrated electron beam additive manufacturing system 100 is merely an example and that other configurations of an electron beam additive manufacturing system 100 are contemplated. Additionally, aspects of the present disclosure may also find application in a laser based additive manufacturing system.

Generally, the electron beam additive manufacturing system 100 herein contemplates electron beam layer manufacturing that may involve manipulating a 3D cad model such that it can be used to generate computer numerically controlled (CNC) tool paths. The tool paths may be programmed such that the part model is "sliced" into layers that when executed on the apparatus of the present teachings, it will result in a near net shape, the result of depositing layer upon layer of material in the correct spatial location in an x-y-z Cartesian coordinate space. An electron beam source 105 (e.g., an EB gun) may be used to supply the energy required to melt and fuse the deposited material, as well as to scan the deposited material for information about the deposit that can be used for a closed loop control operation. For example, the teachings herein contemplate using information about the x-ray emissions generated from impingement of the electron beam with the deposited material (or the material of the verification plate 300, FIG. 3) to control the operation of the electron beam source 105 such as its power, current, voltage, beam characteristic or any combination thereof.

Turning to FIG. 1, electron beam additive manufacturing system 100 may include an electron beam source 105 capable of generating and emitting an electron beam 110. The electron beam 110 may be emitted along an emission path past an astigmatism device 120, a beam-focusing device 122, and/or an electron beam position control device 124. The astigmatism device 120 may be a lens and/or a coil assembly configured to reduce astigmatism of the electron beam 110 by imposing a weak electric or magnetic field on the electron beam. The beam-focusing device 122 may be a device capable of focusing the electron beam 110. The beam-focusing device 122 may implement a series of windings that the electron beam passes through. An electric current applied to the windings may cause the electron beam 110 to exhibit a variety of focal length depending on the amount of electric current applied to the windings. The focused electron beam 110 may further be directed to impinge predefined areas of a powder bed 170 or a verification plate 300 (FIG. 3) implemented in place of powder in the powder bed 170 using an electron beam position control device 124. The electron beam position control device 124 may use magnetic fields to adjust the electron beam path so that the electron beam 110 may be selectively and controllably directed to various portions of the powder bed 170 or verification plate 300 to selectively impinge material therein to melt material.

In some embodiments, the electron beam 110 enters a vacuum chamber where the electron beam 110 impinges a layer of powder in a powder bed 170 supported on a build platform 180. The vacuum chamber may include a heat shield 130 that creates a controllable environment to improve melting activity of the powder in the powder bed 170. Powder may be dispensed lay-by-layer on the build platform 180 via powder material hoppers 140 and a powder dispensing and leveling apparatus (not shown). It is understood that while the electron beam additive manufacturing system 100 is described with reference to using powder in a powder bed 170 to make a component 172, systems and methods described herein use a verification plate 300 to perform calibration, verification, and development activities. The verification plate 300 is depicted and described in more detail herein, in particular, with respect to FIG. 3.

Still referring to FIG. 1, when an electron beam 110 impinges material such as a verification plate 300 or powder in a powder bed 170, x-rays 160 are generated and emitted. The emitted x-rays 160 may be detected by an x-ray detection sensor 150 configured to generate a waveform 400 (FIG. 4) corresponding to the amount of x-rays detected by the x-ray detection sensor 150. The x-ray detection sensor 150 is a sensor capable of detecting the presence and amount of x-rays over a period of time and output a signal (e.g., a digital signal) corresponding to the amount of x-rays detected. The x-ray detection sensor 150 may be located at any location within the build chamber such that x-ray emissions from the verification plate may be captured. In one embodiment, the x-ray detection sensor 150 may be positioned on or near the roof of the build chamber. Other embodiments may include the x-ray detection sensor 150 at a different location. The x-ray emission behavior directly relates to the density of the exposed material of a verification plate 300. As different materials and different amounts of each material are melted correlated amounts of x-rays are generated and detected. For example, this means that once the surface material of a verification plate 300 has been melted and the subsurface (e.g., made of tungsten) is exposed, a digital signal representative of the amount of x-rays emitted and detected can then be related to beam behavior with respect to material melting. Beam behavior may be defined by parameters such as electron beam size, shape, power, the velocity at which the beam is directed across the surface of a powder bed 170 or a verification plate.

Embodiments of an electron beam additive manufacturing system 100 may also include an electronic control unit 115, such as a computing device for controlling aspects of the electron beam additive manufacturing system 100. The electronic control unit 115 may include a display 115a, a processing unit 115b and an input device 115c, each of which may be communicatively coupled to together and to the electron beam additive manufacturing system 100. The electronic control unit 115 may receive signals from one or more sensors of the electron beam additive manufacturing system 100 and control functions of the electron beam additive manufacturing system 100 such as implementing a predetermined build protocol to create a component 172 or carry out a process such as calibration, verification, or development tests.

Figure 2:
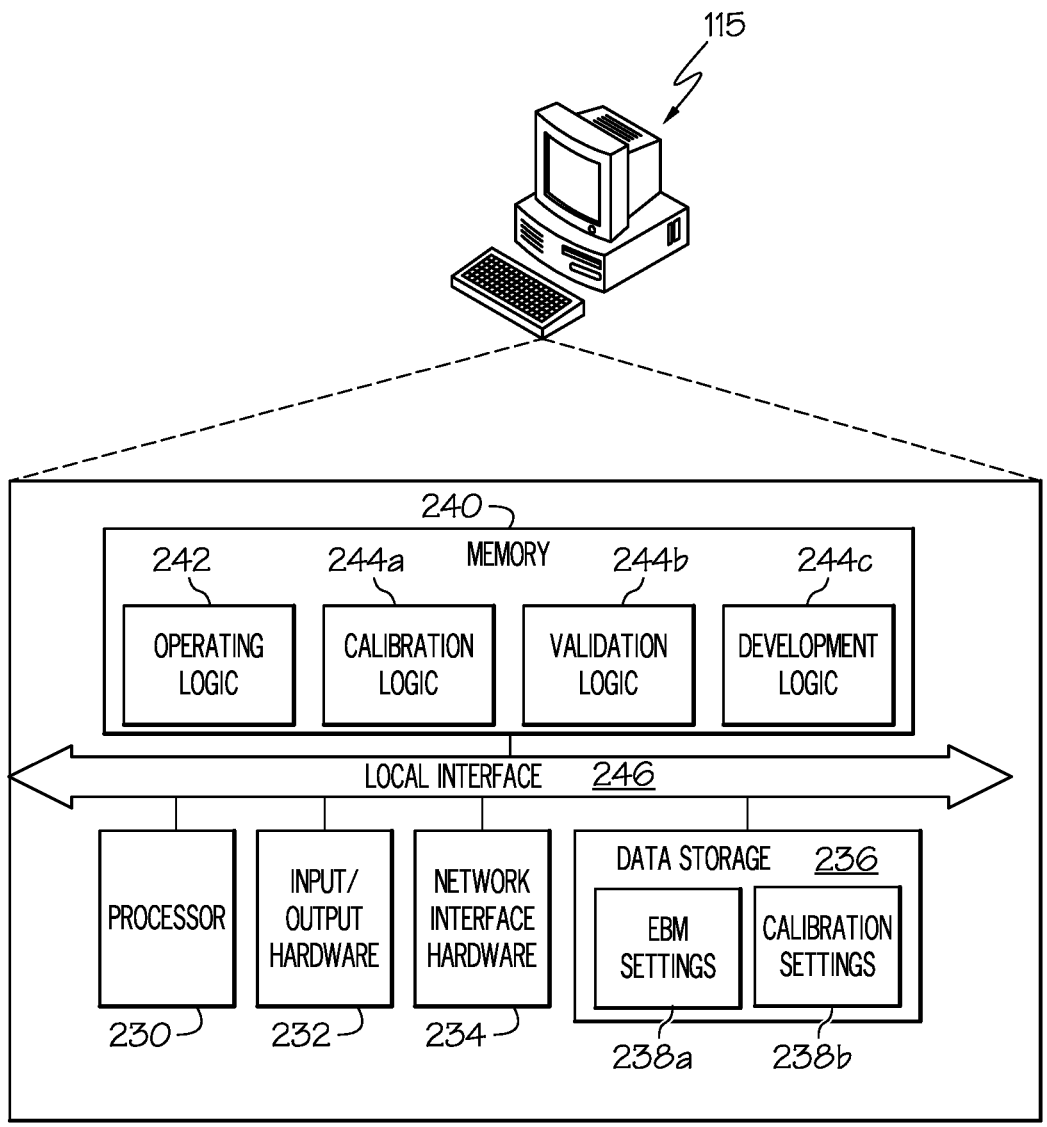
FIG. 2 schematically depicts an example electronic control unit for an electron beam additive manufacturing system according to one or more embodiments shown and described herein.

Turning to FIG. 2, an exemplary electronic control unit 115 for an electron beam additive manufacturing system 100 is depicted and described in more detail. The electronic control unit 115 may include a processor 230, input/output hardware 232, network interface hardware 234, a data storage component 236, which stores electron beam manufacturing (EBM) settings a 238a, calibration settings 238b including for example expected melt performance for a particular electron beam configuration and material, and a memory component 240. The memory component 240 may be machine-readable memory (which may also be referred to as a non-transitory computer readable memory). The memory component 240 may be configured as volatile and/or nonvolatile memory and, as such, may include random access memory (including SRAM, DRAM, and/or other types of random access memory), flash memory, registers, compact discs (CD), digital versatile discs (DVD), and/or other types of storage components. Additionally, the memory component 240 may be configured to store operating logic 242, calibration logic 244a, validation logic 244b, development logic 244c, and the like (each of which may be embodied as a computer program, firmware, or hardware, as an example). A local interface 246 is also included in FIG. 2 and may be implemented as a bus or other interface to facilitate communication among the components of the electronic control unit 115.

The processor 230 may include any processing component(s) configured to receive and execute instructions (such as from the data storage component 236 and/or memory component 240). The instructions may be in the form of a machine-readable instruction set stored in the data storage component 236 and/or the memory component 240. The input/output hardware 232 may include a monitor, keyboard, mouse, printer, camera, microphone, speaker, and/or other device for receiving, sending, and/or presenting data. The network interface hardware 234 may include any wired or wireless networking hardware, such as a modem, LAN port, Wi-Fi card, WiMax card, mobile communications hardware, and/or other hardware for communicating with other networks and/or devices.

It should be understood that the data storage component 236 may reside local to and/or remote from the electronic control unit 115 and may be configured to store one or more pieces of data for access by the electronic control unit 115 and/or other components. As illustrated in FIG. 2, the data storage component 236 stores EBM settings 238a and calibration settings 238b. The EBM settings 238a may include predetermined parameters that are specific to a build and material. The calibration settings 238b may include data such as expected melt performance values that may be used for verifying and/or calibrating the electron beam additive manufacturing system 100. The EBM settings 238a and the calibration settings 238b will be described in more detail herein.

Included in the memory component 240 are the operating logic 242, the calibration logic 244a, the validation logic 244b, the development logic 244c, and the like. The operating logic 242 may include an operating system and/or other software for managing components of the electron beam additive manufacturing system 100. Each of the calibration logic 244a, the validation logic 244b, the development logic 244c may define processes and/or sub-routines for supporting operations of the electron beam additive manufacturing system 100 when performing calibration of parameters of the system, verification of a material or EBM setting 238a, and/or development activities such as determining an ideal setting for achieving a desired melt performance.

It should also be understood that the components illustrated in FIG. 2 are merely exemplary and are not intended to limit the scope of this disclosure. More specifically, while the components in FIG. 2 are illustrated as residing within the electronic control unit 115, this is merely an example. In some embodiments, one or more of the components may reside external to the electronic control unit 115. Similarly, while FIG. 2 is directed to the electronic control unit 115, other components may include similar hardware, software, and/or firmware.

Figure 3:
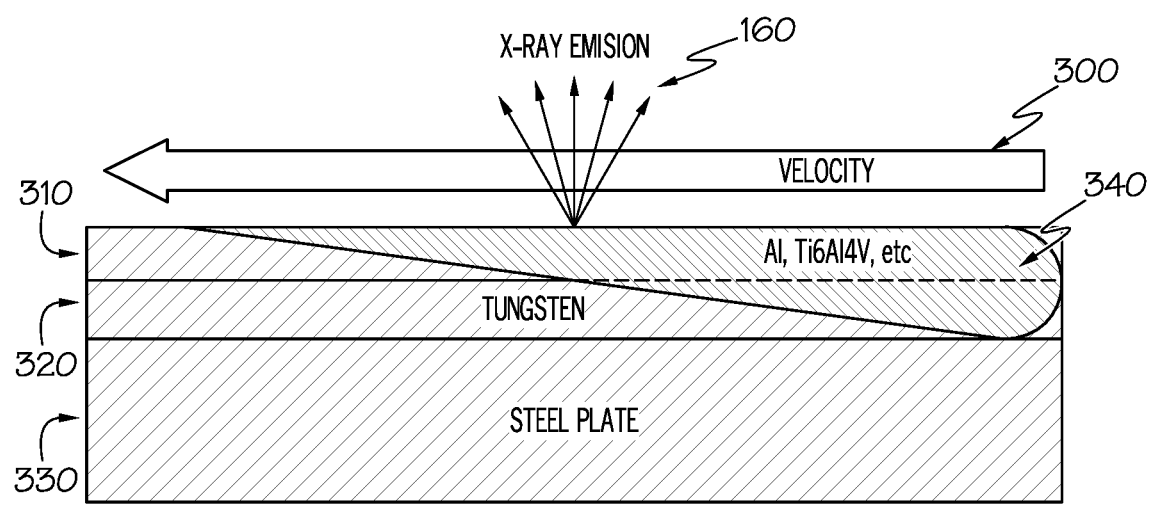
FIG. 3 schematically depicts a cross-sectional view of a verification plate according to one or more embodiments shown and described herein.

As referenced above, embodiments of the present disclosure provide systems and method for automatically evaluating melt performance in an additive manufacturing system. These systems and methods may enable automatic calibration, verification, and process development techniques for an electron-beam additive manufacturing device. In some embodiments, the electron beam additive manufacturing system includes an electron beam source 105, an x-ray detection sensor 150 configured to generate a waveform corresponding to the amount of x-rays 160 detected by the x-ray detection sensor and an electronic control unit 115. The electronic control unit is communicatively coupled to the electron beam source 105 and the x-ray detection sensor 150. The electronic control unit 115 is configured to cause an electron beam source 105 to emit an electron beam such that the electron beam impinges a verification plate. The electronic control unit 115 further receives the waveform generated by the x-ray detection sensor in response to the x-ray detection sensor capturing x-rays emitted from the impingement of the electron beam 110 with the verification plate 300 (FIG. 3). The electronic control unit may then determine a melt performance of a surface material of the verification plate 300 based on the waveform.

Turning to FIG. 3, a cross-sectional view of a verification plate 300 is depicted. The present disclosure provides systems and methods for determining melt performance of a system without the need for powder. To do so, a verification plate 300 may be used in place of the powder in a powder bed. The verification plate 300 may be positioned on the build platform 180 such that an electron beam 110 emitted from the electron beam source 105 impinges predetermined portions of the verification plate 300 causing x-rays 160 to be emitted and one or more layers 310, 320, 330 of the verification plate 300 to melt. The verification plate 300 includes two or more layers of material. As depicted the verification plate 300 includes a surface material 310, a subsurface layer 320 layered below the surface material 310 and a base material 330 supporting the surface material 310 and subsurface layer 320. Each layer may have a predetermined type of material and a predetermined thickness. The type of material of each layer may be selected such that different amounts of x-rays 160 are emitted when impinged with an electron beam 110. In other words, the type of material has a definable x-ray 160 emission profile when impinged with an electron beam. The layers of the verification plate may include a combination of metals and/or alloys, for example but without limitation, aluminum (Al), Ti6Al4V, Ti6Al5V stainless steel, copper (Cu), silver (Ag), platinum (Pt), gold (Au), or refractory metals such as molybdenum (Mo) or tungsten (W), or the like. It is the differences in the x-ray 160 emission profiles that enables the electronic control unit 115 to determine a melt performance such as a density of the material that is melted by the electron beam 110. The emission profile may be defined by a waveform generated by an x-ray detection sensor, which will be described in more detail with reference to FIG. 4. The differences in the x-ray 160 emission profiles, for example the different amounts of x-rays 160 emitted may also be used to identify the type of material being melted and/or the depth of the melt. That is, the x-ray 160 emissions of a material impinged by a predetermined electron beam may be characterized such that the emission profile may be used to identify the type of material being melted.

FIG. 3 further depicts a melt depth 340 as a function of the velocity at which an electron beam 110 is moved across the verification plate 300. For example, as the velocity of an otherwise steady electron beam that is moved across the verification plate increases, the depth of a melt of one or more layers of materials of the verification plate may decrease. Melt depth may be an attribute of the determined melt performance and thereby be used to determine a range of movement velocities that will achieve a desired melt performance. In other words, the electronic control unit 115 may determine a maximum velocity that the electron beam is capable of moving across the verification plate such that a predetermined thickness of the surface material and/or the subsurface material is melted based on the melt performance.

It is further understood that other attributes of an electron beam 110 or movement thereof may also be determined based on the melt performance of the verification plate 300. By way of another example, an electron beam size and/or shape may be tuned based on the melt performance of the verification plate 300. A small focused electron beam size as defined based on the spot formed when the electron beam 110 impinges the verification plate 300 may provide more concentrated melting of the material in a short amount of time relative to a larger electron beam size. Similarly, a shape of the electron beam may provide stronger melt lines in one direction versus another direction. That is, depending on the shape of the beam and the direction (i.e., movement path) of the electron beam 110 across the verification plate 300, different melt performances may result. Moreover, different locations on the verification plate 300 impinged by the same electron beam 110 configuration may have different melt performances. Accordingly, the systems and methods described herein may identify these variations and develop calibration setting to adjust for the differences in melt performances at different locations so that a uniform or expected melt performance may be achieved consistently across a build platform 180 being calibrated with the verification plate 300.

Figure 4:
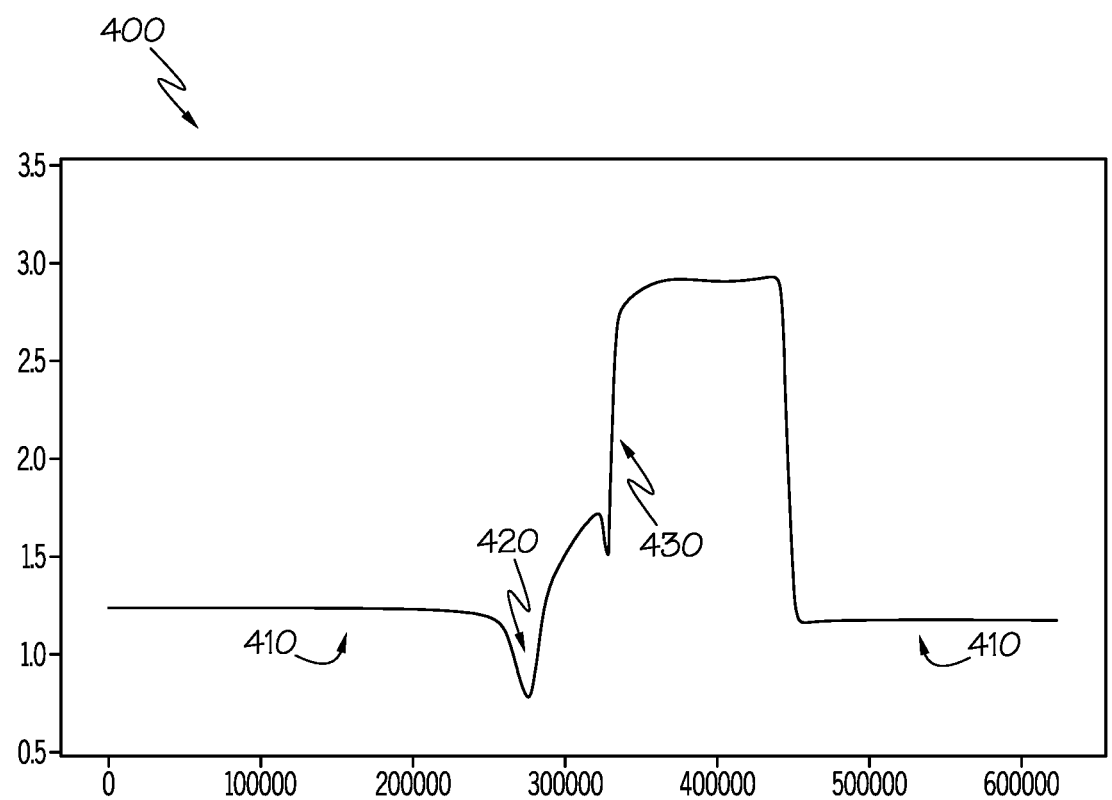
FIG. 4 depicts an illustrative waveform generated by an x-ray detection sensor according to one or more embodiments shown and described herein.

Turning to FIG. 4, illustrative waveform 400 generated by an x-ray detection sensor is depicted. The waveform 400 depicts amounts of x-rays detected over cycles (e.g., time). The waveform depicted includes three distinct portions 410, 420, and 430 defining different melt performances. The first portion 410 depicts the x-ray 160 emissions detected when the electron beam impinges the build platform 180, because the electron beam 110 has not yet been moved to impinge the verification plate 300. Once moved to impinge the verification plate 300, for example, as depicted by the second portion 420, a melt performance representing the melting of a surface material 310 comprising aluminum is digitally captured. As the electron beam 110 increases the melt depth of the surface material 310 (e.g., the density of melted material) the amount of x-rays 160 emitted increases. Once the surface material is melted through, a stepwise change in the amount of x-rays 160 detected is digitally captured, for example as depicted by the third portion 430. This stepwise change is a result of the electron beam 110 now impinging the subsurface layer 320, which is different from the surface material 310. The subsurface layer 320 may be tungsten, for example. The electronic control unit 115 may receive and process the waveform generated by the x-ray detection sensor to determine melt performances at various known locations on the verification plate 300. The melt performances may define the density of the surface material that is melted and in some instances may be correlated with known melt performances to determine the type of material that is being melted.

Figure 5:
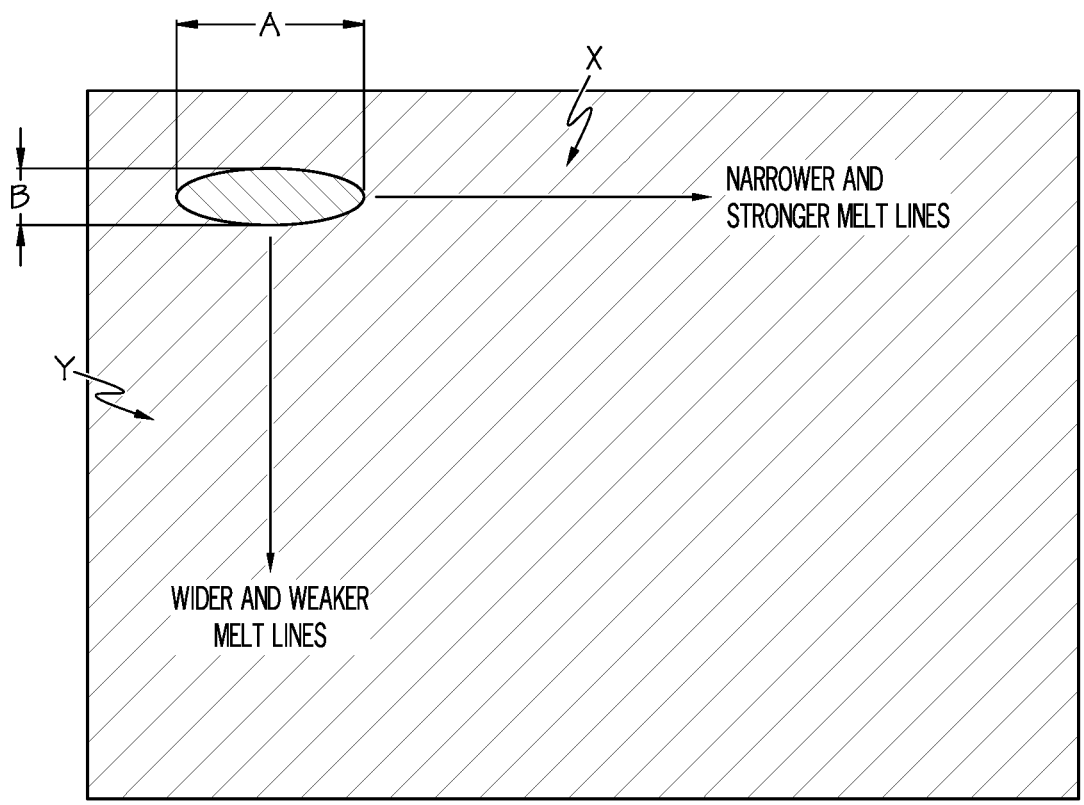
FIG. 5 depicts an illustrative cross-section of an electron beam impinging a verification plate according to one or more embodiments shown and described herein.

In some embodiments, for example, when building a component using a powder bed, the waveform may be used to automatically adjust electron beam parameters such that predetermined melt depths and volumes of powder may be melted. In other words, the waveform indicating the amount of x-rays detected from an electron beam impinging powder or the verification plate may provide a closed loop feedback process that can monitor and ensure desired melt performances are achieved throughout a build. As referenced above, some of the electron beam parameters include the size, the shape, the power, and the direction of movement of the electron beam 110. FIG. 5 depicts an illustrative cross-section of an electron beam impinging a verification plate 300. The cross-section of an electron beam (e.g., the spot) form when the electron beam impinges the verification plate has a shape and a size that may be generally quantified by a length "A" and a width "B." The length "A" and the width "B" of the electron beam 110 may be adjusted by controlling, for example, the beam focusing device 122, the electron beam position control device 124, and/or other lens. The length "A" and the width "B" of the electron beam 110 may have different melt performances depending on the direction the electron beam 110 is moved. For example, as depicted an electron beam 110 having a length "A" that is greater than its width "B" that is moved in the X direction will have a narrower but stronger melt line as opposed to the same electron beam 110 that is moved in the Y direction. The systems and methods described herein may verify such melt performances and implement adjustments to build parameters such as performing movements in the Y direction slower than those in the X direction and/or performing additional adjacent passes to and fro in the X direction so that uniform or near uniform melt performances may be achieved with building a component. In other words, the systems and methods described herein may use the verification plate to characterize and/or adjust the electron beam 110 to known configurations so that a build file defining steps for building a component implemented on one AM machine does not need to be rewritten to account for a particular configuration on another AM machine.

Figure 6A:
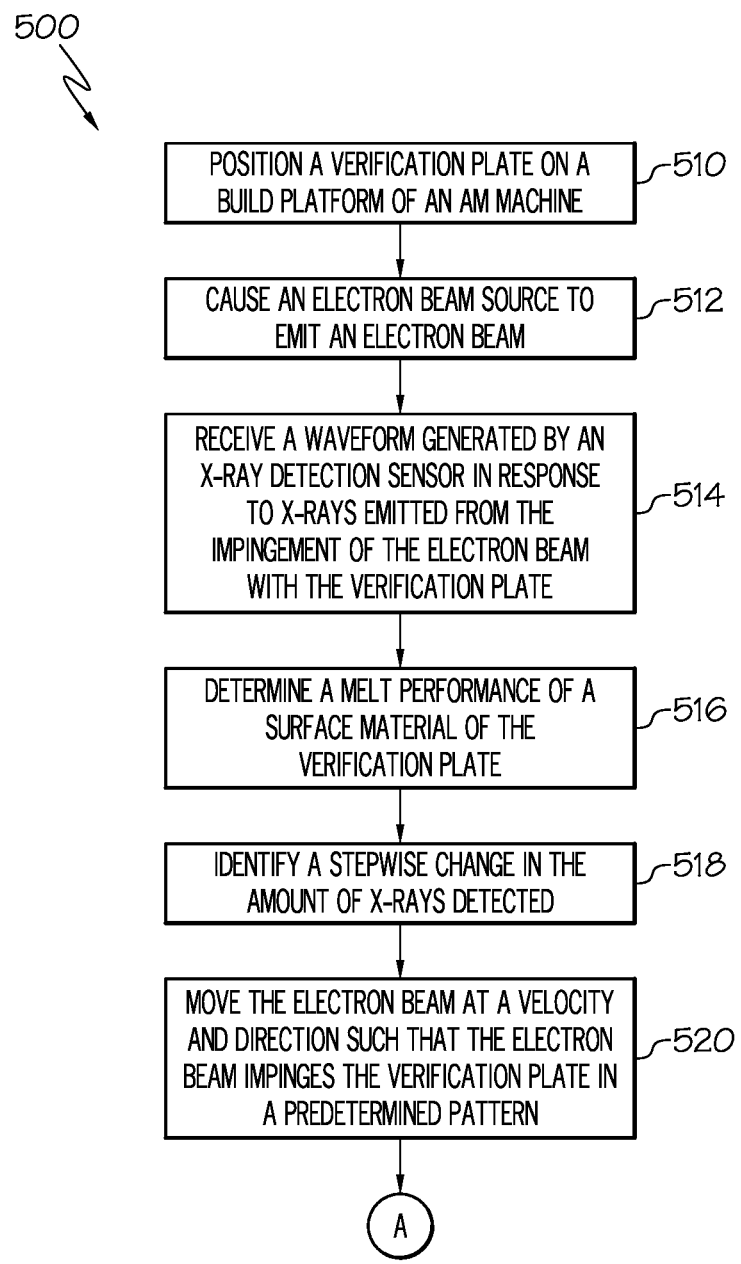
FIG. 6A depicts a flowchart of an example method of automatically determining a melt performance of a verification plate impinged by an electron beam according to one or more embodiments shown and described herein.
Figure 6B:
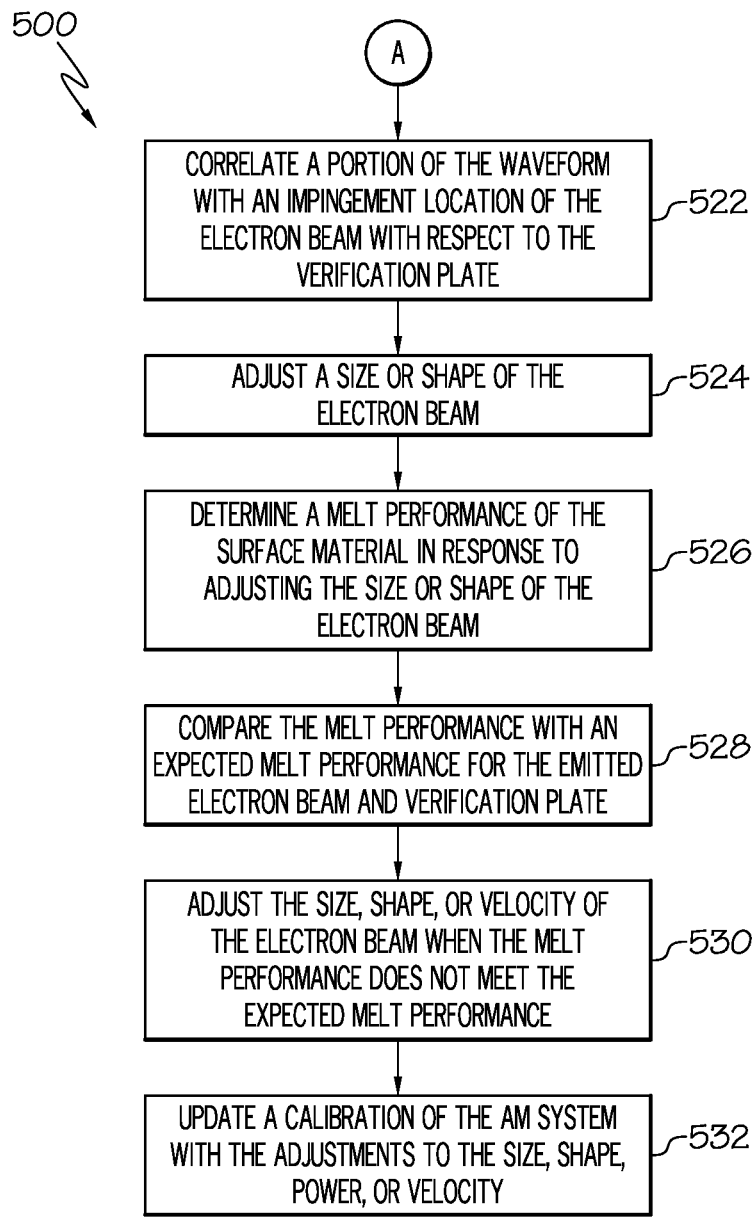
FIG. 6B depicts a continuation of the flowchart depicted in FIG. 6A according to one or more embodiments shown and described herein.

Turning now to FIGS. 6A-6B, a flowchart 500 of an example method of automatically determining melt performance of a verification plate impinged by an electron beam is depicted. The following method will be described as generally implemented by an electronic control unit 115, however, it is understood that one or more computing devices may implement one or more aspects described herein. Additionally, one or more subroutines or other methods may be compiled based on the steps described and depicted with reference to FIGS. 6A-6B. At block 510, a verification plate 300 (FIG. 3) may be positioned on a build platform 180 (FIG. 1) of the additive manufacturing machine. The verification plate 300 may include two or more layers of material having predetermined thickness and where adjacent layers of comprise different materials. At block 512, an electronic control unit 115, causes an electron beam source 105 (FIG. 1) to emit an electron beam. The electronic control unit 115 may accomplish this by generating and transmitting a signal to the electron beam source 105 to activate. The electronic control unit 115 may further generate and transmit one or more signals to the astigmatism device 120, the beam focusing device 122, and/or the electron beam position control device 124 to configure the emission of the electron beam 110 along a beam path toward the verification plate 300. At block 514, the electronic control unit 115, receives a waveform 400 (e.g., FIG. 4) generated by the x-ray detection sensor 150 (FIG. 1) in response to the x-ray detection sensor 150 capturing x-rays 160 emitted from the impingement of the electron beam 110 with the verification plate 300. The waveform 400 defines the amount of x-rays 160 detected by the x-ray detection sensor 150.

At block 516, a melt performance of at least a surface material 310 of the verification plate 300 based on the waveform 400 may be determined by the electronic control unit 115. The melt performance may define a density of the surface material that is melted by the electron beam. The electronic control unit 115 may further process the determined melt performance and, if present, identify a stepwise change in the amount of x-rays detected based on the waveform at block 518. The stepwise change (e.g., the change from the second portion 420 to the third portion 430 depicted in FIG. 4) indicates exposure of a subsurface layer 320 (FIG. 3) of material positioned below the surface material 310 of the verification plate 300. Identification of the stepwise change or other sought attribute of the waveform 400 such as a change in slope may indicate a change in the melt performance. The changes identified may be correlated to electron beam behaviors and/or setting that produce the electron beam. These settings may be stored in the non-transitory computer readable memory for implementation during builds of a component 172.

In some embodiments, the electron beam's impingement with the verification plate 300 may be captured as the electron beam 110 moves about a predetermined pattern/path over the verification plate 300. That is, at block 520, the electronic control unit 115 may cause the electron beam position control device 124 to move the electron beam 110 at a velocity and a direction such that the electron beam 110 impinges the verification plate 300 in a predetermined pattern. In some embodiments, the electronic control unit 115 causes the electron beam position control device 124 to move the electron beam 110 with an increasing velocity such that the electron beam 110 impinges the verification plate 300 over a predefined length. The melt performance of the surface material 310 of the verification plate 300 over the length and/or the predetermined pattern based on the waveform 400 is determined. As described herein, the melt performance provides a measurement of the density of the melt of the surface material at various velocities and positions on the verification plate 300. The electronic control unit 115 correlates portions of the waveform 400 with electron beam output settings and positions on the verification plate 300 (i.e., also the build platform 180), at block 522. The correlation of position, settings, and melt performance as defined through the waveform 400 provides important and useful information for calibrating and verifying the functionality of an electron beam additive manufacturing system. That is, melt performance may vary across the build platform 180, so having the ability to correlate a position with the waveform data and electron beam settings, adjustments and/or calibrations may be made to achieve more uniform manufacturing of a component across all portions of the build platform 180. The electronic control unit 115 may also adjust the size, shape, and even the power of the electron beam 110 as depicted in block 524. The melt performance of the verification plate 300 may also be determined in response to adjusting the size, shape, and/or power of the electron beam 110 as depicted in block 526.

In some embodiments, the electronic control unit 115, for example, as depicted in block 528, may compare the melt performance determined based on the waveform 400 with an expected melt performance for the emitted electron beam 110 and the verification plate 300. That is, the expected melt performance may define benchmark results optionally with tolerance ranges for verifying the operation of an electron beam additive manufacturing system 100. For example, such a verification may be necessary when initially setting up a machine or even prior to a build to assure the system is operating with expected specifications. In the event the melt performance does not meet an expected melt performance, for example, with an acceptable tolerance, the electronic control unit may adjust one or more of the electron beam parameters, including the size, shape, velocity or the power as depicted in block 530. The adjustments, if they correct the operation of the machine, may be updated as new calibration settings for the electron beam additive manufacturing system 100 at block 532. Accordingly, the electron beam additive manufacturing system 100 may be verified and even calibrated automatically without third party measurements and manual inputs containing new calibration values. Furthermore, the systems and methods described herein can eliminate the need for visual inspection of a verification plate 300, however, verification plates 300 may be retained and periodically compared with future verification plates as a secondary confirmation that the machine continues to operate within specification.

The functional blocks and/or flowchart elements described herein may be translated onto machine-readable instructions. As non-limiting examples, the machine-readable instructions may be written using any programming protocol, such as: descriptive text to be parsed (e.g., such as hypertext markup language, extensible markup language, etc.), (ii) assembly language, (iii) object code generated from source code by a compiler, (iv) source code written using syntax from any suitable programming language for execution by an interpreter, (v) source code for compilation and execution by a just-in-time compiler, etc. Alternatively, the machine-readable instructions may be written in a hardware description language (HDL), such as logic implemented via either a field programmable gate array (FPGA) configuration or an application-specific integrated circuit (ASIC), or their equivalents. Accordingly, the functionality described herein may be implemented in any conventional computer programming language, as pre-programmed hardware elements, or as a combination of hardware and software components.

It should now be understood that the systems and methods described herein provide automated means that take advantage of the x-ray emission behavior of an electron beam impinging a verification plate to produce an x-ray signal that directly relates to the density of the exposed material. That is, when an electron beam impinges material such as a bimetallic plate x-rays are emitted. This means that once the surface material has been melted and the subsurface (e.g., tungsten) is exposed, a digital signal is generated by an x-ray detection sensor in response to the emitted x-rays which can then be related to beam behavior with respect to material melting. The melting behavior of a bimetallic plate may be used to measure the beam properties in an additive manufacturing (AM) system for calibration, verification and process development of AM materials.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

Further aspects of the invention are provided by the subject matter of the following clauses:

A first aspect A1 includes an electron beam additive manufacturing system includes an electron beam source, an x-ray detection sensor configured to generate a waveform corresponding to an amount of x-rays detected by the x-ray detection sensor, and an electronic control unit comprising a processor and a non-transitory computer-readable memory, the electronic control unit communicatively coupled to the electron beam source and the x-ray detection sensor. The electronic control unit is configured to cause the electron beam source to emit an electron beam such that the electron beam impinges a verification plate, receive the waveform generated by the x-ray detection sensor in response to the x-ray detection sensor capturing x-rays emitted from the impingement of the electron beam with the verification plate, and determine a melt performance of a surface material of the verification plate based on the waveform.

A second aspect A2 includes the system of the first aspect A1, wherein the melt performance defines a density of the surface material that is melted by the electron beam.

A third aspect A3 includes the system of any preceding aspect, wherein the electronic control unit is further configured to: identify a stepwise change in the amount of x-rays detected based on the waveform, wherein the stepwise change indicates exposure of a subsurface layer of material positioned below the surface material of the verification plate.

A fourth aspect A4 includes the system of any preceding aspect, further comprises an electron beam position control device communicatively coupled to the electronic control unit, wherein the electronic control unit is further configured to cause the electron beam position control device to move the electron beam at a velocity and a direction such that the electron beam impinges the verification plate in a predetermined pattern.

A fifth aspect A5 includes the system of the fourth aspect A4, wherein the electronic control unit is further configured to correlate a portion of the waveform received from the x-ray detection sensor with an impingement position of the electron beam with respect to the verification plate.

A sixth aspect A6 includes the system of the fourth aspect A4, wherein the electronic control unit is further configured to cause the electron beam position control device to move the electron beam with an increasing velocity such that the electron beam impinges the verification plate over a predefined length, and determine the melt performance of the surface material of the verification plate over the predefined length based on the waveform, wherein the melt performance provides a measurement of a density of the melt of the surface material at various velocities and positions on the verification plate.

A seventh aspect A7 includes the system of the sixth aspect A6, wherein the electronic control unit is further configured to determine a maximum velocity that the electron beam is capable of moving across the verification plate such that the thickness of the surface material to the subsurface material is melted based on the melt performance, and store the maximum velocity in the non-transitory computer-readable memory.

An eighth aspect A8 includes the system of the fourth aspect A4 and further comprising a beam focusing device capable of adjusting a size or a shape of the electron beam, wherein the electronic control unit is further configured to cause the beam focusing device to adjust the size or the shape of the electron beam impinging the verification plate as the electron beam position control device to move the electron beam at the velocity and the direction across the verification plate, and determine the melt performance of the surface material of the verification plate based on the waveform in response to adjusting the size or shape of the electron beam impinging the verification plate.

A ninth aspect A9 includes the system of any preceding aspect, wherein the verification plate comprises at least two predefined layers of material each having a predetermined thickness.

A tenth aspect A10 includes the system of any preceding aspect, wherein the verification plate comprises at least one of A1, Ti6Al4, or tungsten.

An eleventh aspect A11 includes a method of determining melt performance of a material impinged by an electron beam in an additive manufacturing system that includes causing, with an electronic control unit, an electron beam source to emit an electron beam such that the electron beam impinges a verification plate, receiving, with the electronic control unit, a waveform generated by an x-ray detection sensor in response to the x-ray detection sensor capturing x-rays emitted from the impingement of the electron beam with the verification plate, and determining a melt performance of a surface material of the verification plate based on the waveform.

A twelveth aspect A12 includes the method of the eleventh aspect A11 and further comprises identifying a stepwise change in an amount of x-rays detected based on the waveform, wherein the stepwise change indicates exposure of a subsurface layer of material positioned below the surface material of the verification plate.

A thirteenth aspect A13 includes the method of any preceding aspect and further comprising causing an electron beam position control device to move the electron beam at a velocity and a direction such that the electron beam impinges the verification plate in a predetermined pattern.

A fourteenth aspect A14 includes the method of aspect thirteenth A13 and further comprising correlating a portion of the waveform received from the x-ray detection sensor with an impingement location of the electron beam with respect to the verification plate.

A fifteenth aspect A15 includes the method of aspect thirteenth A13 and further comprising causing the electron beam position control device to move the electron beam with an increasing velocity such that the electron beam impinges the verification plate over a predefined length, determining the melt performance of the surface material of the verification plate over the predefined length based on the waveform, wherein the melt performance provides a measurement of a density of the surface material at various velocities and positions on the verification plate, determining a maximum velocity that the electron beam is capable of moving across the verification plate such that the thickness of the surface material to the subsurface material is melted based on the melt performance, and storing the maximum velocity in the non-transitory computer-readable memory.

A sixteenth aspect A16 includes the method of aspect thirteenth A13 and further comprising causing a beam focusing device to adjust a size or a shape of the electron beam impinging the verification plate as the electron beam position control device to move the electron beam at the velocity and the direction across the verification plate, and determining the melt performance of the surface material of the verification plate based on the waveform in response to adjusting the size or shape of the electron beam impinging the verification plate.

A seventeenth aspect A17 includes the method of any preceding aspect and further comprising determining a composition of material of the surface material based on the melt performance.

An eighteenth aspect A18 includes a method of verifying an electron beam configuration of an additive manufacturing system includes causing an electron beam source to emit an electron beam such that the electron beam impinges a verification plate, wherein the electron beam is configured to impinge the verification plate with a predetermined size, a predetermined shape, moving across the verification plate at a predetermined velocity; receiving, with an electronic control unit, a waveform generated by an x-ray detection sensor in response to the x-ray detection sensor capturing x-rays emitted from the impingement of the electron beam with the verification plate, and determining a melt performance of a surface material of the verification plate based on the waveform, comparing the melt performance determined based on the waveform with an expected melt performance for the emitted electron beam and the verification plate, and adjusting at least one of the predetermined size, the predetermined shape, or predetermined velocity of the electron beam when the melt performance determined based on the waveform does not meet the expected melt performance with in an acceptable tolerance.

A nineteenth aspect A19 includes the method of any preceding aspect and further comprising adjusting a power level of the electron beam when the melt performance determined based on the waveform does not meet the expected melt performance with in the acceptable tolerance.

A twentieth aspect A20 includes the method of any preceding aspect further comprising updating a calibration of the additive manufacturing system with the adjustments to at least one of the predetermined size, the predetermined shape, predetermined velocity, or a power level of the of the electron beam.

What is claims is:

1. An electron beam additive manufacturing system comprising:
    an electron beam source;
    an x-ray detection sensor configured to generate a waveform corresponding to an amount of x-rays detected by the x-ray detection sensor; and
    an electronic control unit comprising a processor and a non-transitory computer-readable memory, the electronic control unit communicatively coupled to the electron beam source and the x-ray detection sensor, and the electronic control unit is configured to:
        cause the electron beam source to emit an electron beam such that the electron beam impinges a verification plate,
        receive the waveform generated by the x-ray detection sensor in response to the x-ray detection sensor capturing x-rays emitted from the impingement of the electron beam with the verification plate, and
        determine a melt performance of a surface material of the verification plate based on the waveform.

2. The system of claim 1, wherein the melt performance defines a density of the surface material that is melted by the electron beam.

3. The system of claim 1, wherein the electronic control unit is further configured to:
    identify a stepwise change in the amount of x-rays detected based on the waveform, wherein the stepwise change indicates exposure of a subsurface layer of material positioned below the surface material of the verification plate.

4. The system of claim 1, further comprising an electron beam position control device communicatively coupled to the electronic control unit, wherein the electronic control unit is further configured to:
    cause the electron beam position control device to move the electron beam at a velocity and a direction such that the electron beam impinges the verification plate in a predetermined pattern.

5. The system of claim 4, wherein the electronic control unit is further configured to:
    correlate a portion of the waveform received from the x-ray detection sensor with an impingement position of the electron beam with respect to the verification plate.

6. The system of claim 4, wherein the electronic control unit is further configured to:
    cause the electron beam position control device to move the electron beam with an increasing velocity such that the electron beam impinges the verification plate over a predefined length, and
    determine the melt performance of the surface material of the verification plate over the predefined length based on the waveform, wherein the melt performance provides a measurement of a density of the melt of the surface material at various velocities and positions on the verification plate.

7. The system of claim 6, wherein the electronic control unit is further configured to:
    determine a maximum velocity that the electron beam is capable of moving across the verification plate such that the thickness of the surface material to the subsurface material is melted based on the melt performance, and store the maximum velocity in the non-transitory computer-readable memory.

8. The system of claim 4, further comprising a beam focusing device capable of adjusting a size or a shape of the electron beam, wherein the electronic control unit is further configured to:
cause the beam focusing device to adjust the size or the shape of the electron beam impinging the verification plate as the electron beam position control device to move the electron beam at the velocity and the direction across the verification plate, and
determine the melt performance of the surface material of the verification plate based on the waveform in response to adjusting the size or shape of the electron beam impinging the verification plate.

9. The system of claim 1, wherein the verification plate comprises at least two predefined layers of material each having a predetermined thickness.

10. The system of claim 1, wherein the verification plate comprises at least one of Al, Ti6Al4, or tungsten.

11. A method of determining melt performance of a material impinged by an electron beam in an additive manufacturing system, the method comprising:
causing, with an electronic control unit, an electron beam source to emit an electron beam such that the electron beam impinges a verification plate;
receiving, with the electronic control unit, a waveform generated by an x-ray detection sensor in response to the x-ray detection sensor capturing x-rays emitted from the impingement of the electron beam with the verification plate; and
determining a melt performance of a surface material of the verification plate based on the waveform.

12. The method of claim 11, further comprising:
identifying a stepwise change in an amount of x-rays detected based on the waveform, wherein the stepwise change indicates exposure of a subsurface layer of material positioned below the surface material of the verification plate.

13. The method of claim 11, further comprising:
causing an electron beam position control device to move the electron beam at a velocity and a direction such that the electron beam impinges the verification plate in a predetermined pattern.

14. The method of claim 13, further comprising:
correlating a portion of the waveform received from the x-ray detection sensor with an impingement location of the electron beam with respect to the verification plate.

15. The method of claim 13, further comprising:
causing the electron beam position control device to move the electron beam with an increasing velocity such that the electron beam impinges the verification plate over a predefined length;
determining the melt performance of the surface material of the verification plate over the predefined length based on the waveform, wherein the melt performance provides a measurement of a density of the surface material at various velocities and positions on the verification plate;
determining a maximum velocity that the electron beam is capable of moving across the verification plate such that the thickness of the surface material to the subsurface material is melted based on the melt performance; and
storing the maximum velocity in the non-transitory computer-readable memory.

16. The method of claim 13, further comprising:
causing a beam focusing device to adjust a size or a shape of the electron beam impinging the verification plate as the electron beam position control device to move the electron beam at the velocity and the direction across the verification plate; and
determining the melt performance of the surface material of the verification plate based on the waveform in response to adjusting the size or shape of the electron beam impinging the verification plate.

17. The method of claim 11, further comprising determining a composition of material of the surface material based on the melt performance.

18. A method of verifying an electron beam configuration of an additive manufacturing system, the method comprising:
causing an electron beam source to emit an electron beam such that the electron beam impinges a verification plate, wherein the electron beam is configured to impinge the verification plate with a predetermined size, a predetermined shape, moving across the verification plate at a predetermined velocity;
receiving, with an electronic control unit, a waveform generated by an x-ray detection sensor in response to the x-ray detection sensor capturing x-rays emitted from the impingement of the electron beam with the verification plate; and
determining a melt performance of a surface material of the verification plate based on the waveform;
comparing the melt performance determined based on the waveform with an expected melt performance for the emitted electron beam and the verification plate; and
adjusting at least one of the predetermined size, the predetermined shape, or predetermined velocity of the electron beam when the melt performance determined based on the waveform does not meet the expected melt performance with in an acceptable tolerance.

19. The method of claim 18, further comprising adjusting a power level of the electron beam when the melt performance determined based on the waveform does not meet the expected melt performance with in the acceptable tolerance.

20. The method of claim 18, further comprising updating a calibration of the additive manufacturing system with the adjustments to at least one of the predetermined size, the predetermined shape, predetermined velocity, or a power level of the electron beam.

* * * * *